United States Patent
Sato et al.

(10) Patent No.: US 10,424,725 B2
(45) Date of Patent: Sep. 24, 2019

(54) SPINTRONICS ELEMENT

(71) Applicant: TOHOKU UNIVERSITY, Sendai-shi, Miyagi (JP)

(72) Inventors: Soshi Sato, Sendai (JP); Masaaki Niwa, Sendai (JP); Hiroaki Honjo, Sendai (JP); Shoji Ikeda, Sendai (JP); Hideo Sato, Sendai (JP); Hideo Ohno, Sendai (JP); Tetsuo Endoh, Sendai (JP)

(73) Assignee: TOHOKU UNIVERSITY, Sendai-shi, Miyagi (JP)

( * ) Notice: Subject to any disclaimer, the term of this patent is extended or adjusted under 35 U.S.C. 154(b) by 0 days.

(21) Appl. No.: 16/013,093

(22) Filed: Jun. 20, 2018

(65) Prior Publication Data

US 2018/0301621 A1 Oct. 18, 2018

Related U.S. Application Data

(63) Continuation of application No. PCT/JP2016/087999, filed on Dec. 20, 2016.

(30) Foreign Application Priority Data

Dec. 25, 2015 (JP) ................... 2015-252942

(51) Int. Cl.
*H01F 10/32* (2006.01)
*H01L 43/10* (2006.01)
(Continued)

(52) U.S. Cl.
CPC ............ *H01L 43/10* (2013.01); *H01F 10/32* (2013.01); *H01F 10/3254* (2013.01);
(Continued)

(58) Field of Classification Search
CPC .... H01F 10/32; H01F 10/3254; H01F 10/329; H01L 43/02; H01L 43/08; H01L 43/10
(Continued)

(56) References Cited

U.S. PATENT DOCUMENTS

2008/0145952 A1* 6/2008 Parkin ............... H01L 29/66984
438/3
2009/0097170 A1* 4/2009 Sato ....................... B82Y 10/00
360/324.12

(Continued)

FOREIGN PATENT DOCUMENTS

JP 2007-048820 A 2/2007
JP 2009-260164 A 11/2009
(Continued)

OTHER PUBLICATIONS

Y. Iba et. al., "A Highly Scalable STT-MRAM fabricated by a Novel Technique for Shrinking a Magnetic Tunnel Junction with reducing Processing Damage", 2014 Symposium on VLSI Technology: Digest of Technical Papers.
(Continued)

*Primary Examiner* — Long K Tran
(74) *Attorney, Agent, or Firm* — Rabin & Berdo, P.C.

(57) ABSTRACT

A spintronics element including a ferromagnetic layer containing boron, and a diffusion stopper film covering a side face of the ferromagnetic layer partially or entirely, the side face in direct contact with diffusion stopper film, so as to prevent out-diffusion of the boron contained in the ferromagnetic layer. The diffusion stopper film contains boron at a concentration higher than a concentration of the boron in a portion of the ferromagnetic layer where the ferromagnetic layer contacts the diffusion stopper film.

11 Claims, 4 Drawing Sheets

(51) Int. Cl.
    *H01L 43/08*    (2006.01)
    *H01L 43/02*    (2006.01)
(52) U.S. Cl.
    CPC ............ *H01L 43/08* (2013.01); *H01F 10/329* (2013.01); *H01L 43/02* (2013.01)
(58) Field of Classification Search
    USPC ........................................................ 257/421
    See application file for complete search history.

(56) References Cited

U.S. PATENT DOCUMENTS

| | | | | |
|---|---|---|---|---|
| 2012/0032288 | A1* | 2/2012 | Tomioka | H01L 43/08 257/421 |
| 2013/0170281 | A1 | 7/2013 | Song et al. | |
| 2014/0197504 | A1* | 7/2014 | Moriyama | G11C 11/161 257/421 |
| 2015/0069554 | A1* | 3/2015 | Nakayama | H01L 43/12 257/421 |
| 2015/0070981 | A1* | 3/2015 | Kumura | H01L 27/228 365/158 |
| 2015/0221847 | A1* | 8/2015 | Hu | H01L 35/22 136/200 |
| 2015/0266717 | A1 | 9/2015 | Okamoto et al. | |
| 2016/0197266 | A1 | 7/2016 | Kitagawa et al. | |

FOREIGN PATENT DOCUMENTS

| | | |
|---|---|---|
| JP | 2012-119564 A | 6/2012 |
| JP | 2012-119684 A | 6/2012 |
| JP | 2015-060970 A | 3/2015 |
| JP | 2015-184036 A | 10/2015 |

OTHER PUBLICATIONS

J. H. Jeong and T. Endoh, "Novel Oxygen Showering Process (OSP) for extreme damage suppression of sub-20nm high density p-MTJ array without IBE treatment", 2015 Symposium on VLSI Technology Digest of Technical Papers.

S. Sato et. al, "Driving Force in Diffusion and Redistribution of Reducing Agents During Redox Reaction on the Surface of CoFeB Film", IEEE Transactions on Magnetics, vol. 51, No. 11, 3400804, Nov. 2015.

* cited by examiner

SPINTRONICS ELEMENT

CROSS REFERENCE TO RELATED APPLICATIONS

This is a continuation application of International Application PCT/JP2016/087999 filed on Dec. 20, 2016, which claims priority from a Japanese Patent Application No. 2015-252942 filed on Dec. 25, 2015, the contents of which are incorporated herein by reference.

BACKGROUND OF THE INVENTION

Technical Field

The invention relates to a spintronics element.

Background Arts

In spintronics elements that contain boron (B) in the ferromagnetic layer such as a magnetic tunnel junction (MTJ) element using a ferromagnetic material for the recording layer and the reference layer, it is necessary to optimize the boron profile (concentration distribution of the boron along the direction perpendicular to the film surface of the recording layer and the reference layer), and keep the boron concentration even along the direction horizontal to the film surface of the recording layer and reference layer, so that the magnetic property thereof is optimized. However, in the conventional spintronics element, the boron diffuses outwardly from the edge surface of the element due to the thermal treatment after dry-etching, oxidation treatment conducted on the surface, or the like during the manufacturing process, and the concentration distribution of the boron thereby changes near the edge surface of the element, which results in the problem of degradation of magnet property.

In particular, with the advancement of miniaturization of the spintronics element in recent years, the out-diffusion of the boron after dry-etching has a greater effect on the internal boron profile of the element. As shown in FIG. 4, for example, if the spintronics element 50 is miniaturized and the pattern dimension thereof is smaller (d→d'; d>d'), the ratio of the layer with degraded magnetic property due to the out-diffusion of boron (hatched area in the figure) 51 to the entire element increases. Therefore, the more miniaturized the element, the greater the magnetic property thereof degrades. FIG. 4 also shows that the variations of the dimension of the spintronics element 50 cause the variations of the internal boron profile of the element, which further cause the variations of the magnetic property.

In order to improve the magnetic property of the spintronics element, a technique to conduct an oxidation treatment on the surface of the magnetic tunnel junction element after the etching process is proposed (see Japanese Patent Application Laid-open Publication No. 2012-119684 (Patent Document 1), Y. Iba, et. al., "A highly scalable STT-MRAM fabricated by a novel technique for shrinking a magnetic tunnel junction with reducing processing damage", VLSI Technology: Digest of Technical Papers, 2014 Symposium on (Non-patent Document 1), or J. H. Jeong and T. Endoh, "Novel oxygen showering process (OSP) for extreme damage suppression of sub-20 nm high density p-MTJ array without IBE treatment", VLSI Technology, 2015 Symposium on (Non-patent Document 2, for example). Also proposed is a technique to form a side-wall metal layer at the side wall portion of the magnetic tunnel junction element, conduct an oxidation treatment on the side-wall metal layer, and thereby form a side-wall metal oxide layer having an insulating property (see Japanese Patent Application Laid-open Publication No. 2012-119564 (Patent Document 2), for example). With those techniques, the oxidized insulating layer is formed at the side wall of the element, which can prevent the short circuit via the side wall or protect the element from the wet washing process or the like.

A resistance-variable memory integrated circuit is also proposed in which the resistance-variable memory element part is protected by a film such as BPSG, BSG, and the like, although this is not to improve the magnetic property but to lower the wiring resistance (see US Patent Application Publication No. 2013/0170281 (Patent Document 3), for example)

SUMMARY OF THE INVENTION

With the manufacturing method of the magnetic tunnel junction element according to Patent Document 1 and Non-patent Documents 1 and 2, if the element contains boron, the out-diffusion of boron, which is contained in the element, from the oxide layer still occurs due to the oxidation treatment, and it was not possible to solve the problem of degradation of magnetic property caused by the out-diffusion of the boron (see S. Sato, et. al, IEEE Trans. Magn. Vol. 51, Issue 11, 3400804, for example). With the manufacturing method of the magnetic tunnel junction element according to Patent Document 2, the boron contained in the element diffuses into the side-wall metal oxide layer and beyond due to the oxidation treatment or the thermal treatment subsequent to the oxidation treatment, and it was not possible to solve the problem of degradation of magnetic property caused by the out-diffusion of the boron. Thus, significant variations in degree of element degradation caused by dimension variations due to the miniaturization of the element still remains, which cause variations in magnetic property. Although the circuit disclosed in Patent Document 3 includes a BPSG film or BSG film, the effect of those films on the prevention of out-diffusion of the boron contained in the element is unknown.

The invention was made in view of those problems, and is aiming at providing a spintronics element that can prevent the degradation of magnetic property caused by the out-diffusion of boron, which ensures excellent magnetic property, and also prevent variations in magnetic property caused by the dimension variations due to the miniaturization.

Generally, the spintronics elements are covered by an SiN film to prevent deterioration in the air after a dry-etching process such as RIE. However, in this case, nitrogen (N) is re-distributed from the SiN film into the spintronics element, which causes degradation of magnetic property. Also, significant variations in degree of element degradation caused by the dimension variations due to the miniaturization of the element remains, which still cause the variations in magnetic property. Thus, the invention is also aiming at providing a spintronics element that can prevent the degradation of magnetic property caused by the re-distribution of nitrogen from outside, and also prevent the variations in magnetic property caused by dimension variations due to miniaturization.

In order to achieve the objects described above, a spintronics element of the invention includes a ferromagnetic layer containing boron, and a diffusion stopper film that is disposed to prevent out-diffusion of the boron contained in the ferromagnetic layer.

Because of the diffusion stopper film, the spintronics element of the invention can prevent the boron contained in the ferromagnetic layer from diffusing outwardly. This way, the boron concentration distribution along the direction horizontal to the film surface of the ferromagnetic layer inside of the element can be kept even and optimal as formed, and as a result, the degradation of magnetic property is prevented. As described above, the spintronics element of the invention has excellent magnetic property. Even if the element dimension varies, the concentration distribution of boron along the direction horizontal to the film surface of the ferromagnetic layer inside of the element does not vary within the element, but is kept even in the optimal state, which makes it possible to prevent the variations in magnetic property. As described above, with the spintronics element of the present invention, the variations in magnetic property caused by dimension variations due to the advancement of miniaturization can be prevented. The diffusion stopper film is made of BSG (boron silicate glass), BPSG (boron phosphorus silicate glass), an oxide film obtained by doping B into $Al_2O_3$, $Y_2O_3$, $ZrO_2$, $MoO_2$, $HfO_2$, $Ta_2O_5$, $WO_3$, $CeO_2$, MgO, or $Gd_2O_3$, or an oxide film of boron, for example.

In the spintronics element according to an aspect of the present invention, it is preferable that the diffusion stopper film be provided so as to cover the entire side faces of the ferromagnetic layer, but the diffusion stopper film may cover a part of the side faces of the ferromagnetic layer. When the diffusion stopper film covers the entire side faces of the ferromagnetic layer, out-diffusion of boron from the side faces of the ferromagnetic layer can be prevented, and the degradation of magnetic property due to the out-diffusion of boron can be substantially prevented. When the diffusion stopper film covers a part of the side faces of the ferromagnetic layer, out-diffusion of boron from the side faces of the ferromagnetic layer is suppressed, and as a result, the degradation of magnetic property can be prevented.

In the spintronics element according to another aspect of the present invention, it is preferable that the diffusion stopper film contain boron at a concentration higher than the concentration of boron contained in the ferromagnetic layer, and in particular, it is preferable that the diffusion stopper film contain boron at a concentration higher than the concentration of boron contained in the side edge portions of the ferromagnetic layer. In this case, it is possible to prevent boron from diffusing from the side edge portions of the ferromagnetic layer toward the diffusion stopper film due to the concentration gradient of boron. Although boron contained in the diffusion stopper film may be diffused outwardly during the oxidation treatment or thermal treatment, the out-diffusion of boron from the ferromagnetic layer can be suppressed.

In the spintronics element according to another aspect of the present invention, it is preferable that the diffusion stopper film be configured to prevent nitrogen from entering the spintronics element from the outside. In this case, the diffusion stopper film can prevent re-distribution of nitrogen into the inside of the element from a film formed outside of the element such as an SiN film. As a result, it is possible to prevent degradation of magnetic property due to the re-distribution of nitrogen. This also makes it possible to prevent the variations of magnetic property due to the uneven degradation of the element caused by the nitrogen, which is caused by the dimension variations due to the miniaturization.

In the spintronics element according to another aspect of the present invention, it is preferable that the diffusion stopper film is free of nitrogen. In this case, it is possible to prevent degradation of the magnetic property caused by re-distribution of nitrogen in the ferromagnetic layer or the like from the diffusion stopper film. It is also possible to prevent variations of magnetic property caused by dimension variations due to miniaturization.

The spintronics element according to another aspect of the invention may have a magnetic tunnel junction element having a recording layer and a reference layer each having the ferromagnetic layer, and an insulating layer disposed between the recording layer and the reference layer, and the diffusion stopper film may be provided so as to cover side faces of the magnetic tunnel junction element. In this case, the degradation of magnetic property of the magnetic tunnel junction element can be prevented.

Furthermore, the spintronics element according to another aspect of the invention may have, for example, a tunnel magnetoresistance device, a tunnel magnetoresistance memory device, a spin Hall effect device, an inverse spin Hall effect device, a domain wall motion memory device or a spin torque high frequency device. In this case, the degradation of magnetic property of each device can be prevented by the diffusion stopper film.

According to the present invention, it is possible to provide a spintronics element that can prevent the degradation of magnetic property due to the out-diffusion of boron, which ensures excellent magnetic property, and also prevent dimension variations due to the miniaturization, which would cause variations in magnetic property. It is also possible to provide a spintronics element that can prevent the degradation of magnetic property caused by the re-distribution of nitrogen from outside, and also prevent the variations in magnetic property caused by dimension variations due to miniaturization.

BRIEF DESCRIPTION OF THE DRAWINGS

FIG. 2A is a cross-sectional view of the first modification example where a recording layer has a multi-layer structure, and FIG. 2B is a cross-sectional view of the second modification example where a recording layer has another multi-layer structure.

DETAILED DESCRIPTION OF THE INVENTION

Below, embodiments of the invention will be explained with reference to the figures.

Figure 1:
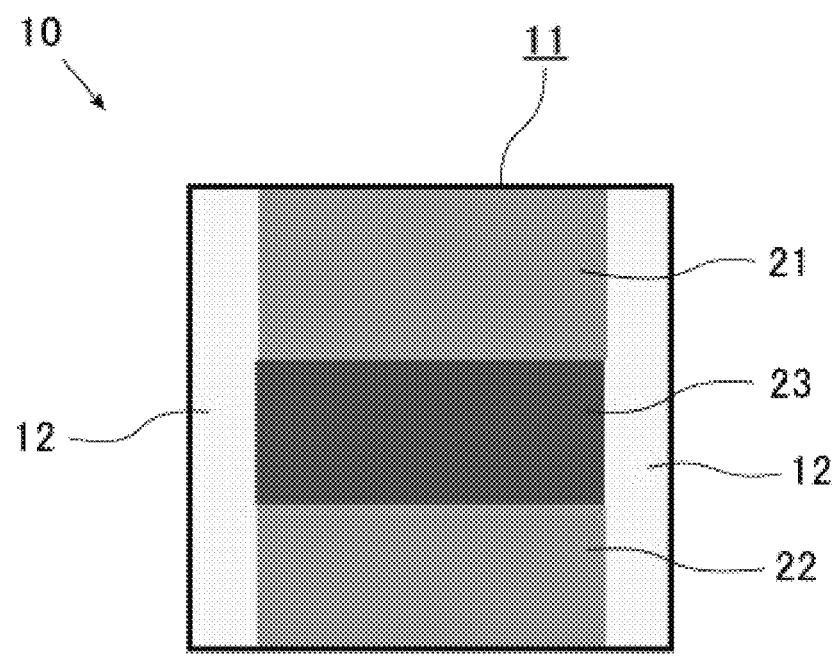
FIG. 1 is a cross-sectional view of a spintronics element of an embodiment of the present invention.
Figure 2A:
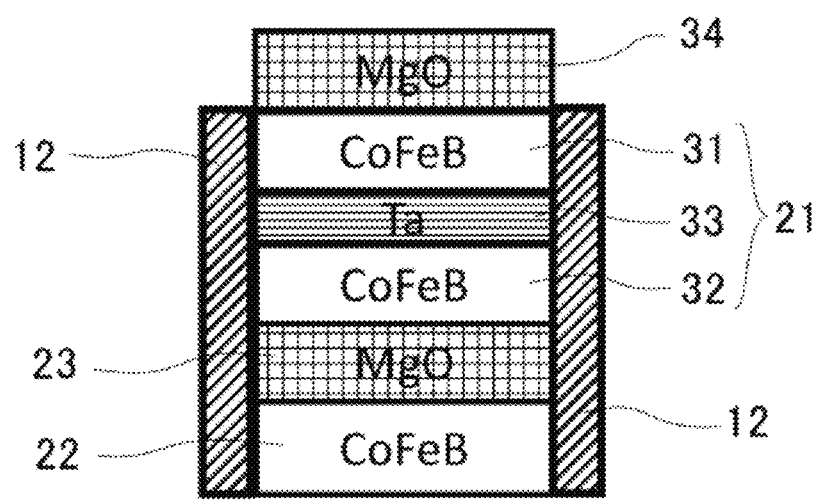
FIG. 2A and FIG. 2B show a spintronics element of an embodiment of the present invention.
Figure 2B:
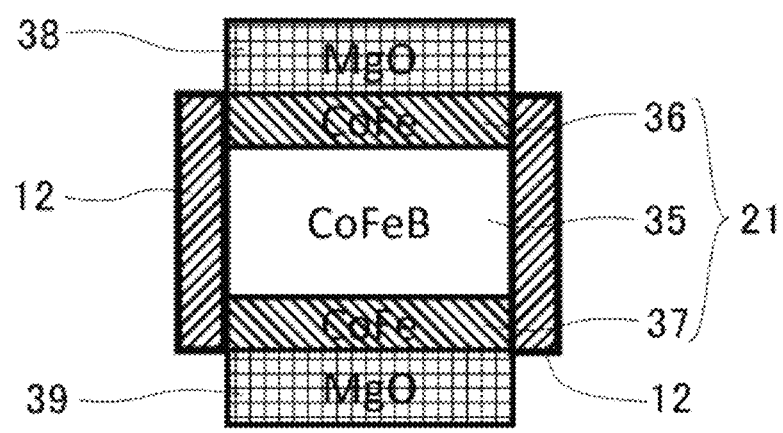
Figure 3:
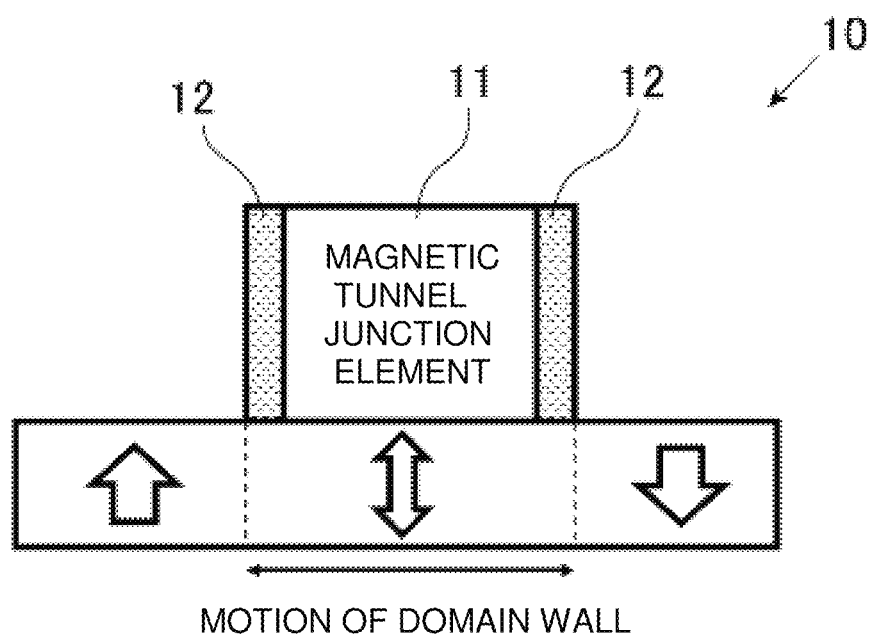
FIG. 3 is a cross-sectional view of a modification example of the spintronics element of an embodiment of the invention where the spintronics element has a domain wall displacement memory element.

FIGS. 1 to 3 show a spintronics element of an embodiment of the present invention.

As shown in FIG. 1, the spintronics element 10 includes a magnetic tunnel junction element 11 and a diffusion stopper film 12.

The magnetic tunnel junction element (MTJ) 11 includes a recording layer 21 and a reference layer 22, which are made of a ferromagnetic layer, and an insulating layer 23 disposed between the recording layer 21 and the reference layer 22. The recording layer 21 and the reference layer 22 are made of a ferromagnetic material, and each contains boron (B). The recording layer 21 and the reference layer 22 are each a magnetic layer made of an alloy such as CoB, FeB or CoFeB, or a magnetic layer containing at least one of those alloys, for example. The insulating layer 23 is made of a material having an insulating property such as MgO. The magnetic tunnel junction element 11 is formed by depositing each layer through spattering, which is a physical deposition method, Molecular Beam Epitaxy (MBE), or the like.

The diffusion stopper film 12 is formed so as to cover the side faces of the magnetic tunnel junction element 11. The diffusion stopper film 12 includes boron at the higher concentration than that of the side edge parts of the recording layer 21, or in other words, portions of the recording layer 21 in contact with the diffusion stopper film 12 and an area nearby (such as 5 nm from the boundary between the recording layer 21 and the diffusion stopper film 12), and that of the side edge parts of the reference layer 22, or in other words, portions of the reference layer 22 in contact with the diffusion stopper film 12 and an area nearby (such as 5 nm from the boundary between the reference layer 22 and the diffusion stopper film 12). This way, the diffusion stopper film 12 can stop the out-diffusion of the boron contained in the recording layer 21 and the reference layer 22. The diffusion stopper film 12 may contain boron at a concentration higher than the concentration of boron contained in the entire recording layer 21 and the entire reference layer 22 so that out-diffusion of boron contained in the recording layer 21 and the reference layer 22 can be prevented. The diffusion stopper film 12 is made of BSG (boron silicate glass) or BPSG (boron phosphorus silicate glass), for example. The diffusion stopper film 12 is formed by the CVD (chemical vapor deposition) method, for example.

As a specific example, when the recording layer 21 and the reference layer 22 are made of $(Co_{25}Fe_{75})_{70}B_{30}$, the molar mass of $(Co_{25}Fe_{75})_{70}B_{30}$ is 42.877 g/mol and the density is 8.2 g/cm$^3$, and therefore, the number concentration of boron in the recording layer 21 and the reference layer 22 is $3.45 \times 10^{22}$ cm$^{-3}$. The diffusion stopper film 12 is formed so as to contain boron at a concentration higher than this number concentration.

Next, the operation will be explained.

In the spintronics element 10, the concentration gradient of boron prevents boron contained in the recording layer 21 and the reference layer 22 from diffusing from the side edge portions of the recording layer 21 and the reference layer 22 toward the diffusion stopper film 12, respectively, which means that the out-diffusion of boron contained in the recording layer 21 and the reference layer 22 is prevented. This way, the boron concentration distribution along the direction horizontal to the film surface of the recording layer 21 and the reference layer 22 inside of the magnetic tunnel junction element 11 can be kept even and optimal as formed. Thus, the boron profile along the direction perpendicular to the film surface of the recording layer 21 and the reference layer 22, which are the ferromagnetic films, can be kept in the optimal state, which makes it possible to prevent the degradation of magnetic property of the magnetic tunnel junction element 11. Also, even if the dimension of the element varies, the boron concentration distribution along the direction horizontal to the film surface of the recording layer 21 and the reference layer 22 inside of the magnetic tunnel junction element 11 does not vary, and instead is kept in the optimal state. Therefore, the boron profile along the direction perpendicular to the film surface of the recording layer 21 and the reference layer 22, which are the ferromagnetic films, can be kept in the optimal state, which makes it possible to prevent variations in magnetic property.

Although boron contained in the diffusion stopper film 12 may be diffused outwardly during the oxidation treatment or thermal treatment, the out-diffusion of boron from the recording layer 21 and the reference layer 22 can be suppressed by the diffusion stopper film 12. As a result, the spintronics element 10 of the invention has excellent magnetic property. Also as described above, with the spintronics element 10, the variations in magnetic property due to variations caused by the advancement of miniaturization can be prevented.

Because the spintronics element 10 includes the diffusion stopper film 12, it is possible to prevent nitrogen from entering the internal structure of the magnetic tunnel junction element 11 such as the recording layer 21 and the reference layer 22. Thus, it is possible to prevent re-distribution of nitrogen into the inside of the element from a film formed outside of the element such as an SiN film. As a result, it is possible to prevent degradation of magnetic property due to the re-distribution of nitrogen. This also makes it possible to prevent the variations of magnetic property due to the uneven degradation of the element caused by the nitrogen, which is caused by the dimension variations due to miniaturization.

In the spintronics element 10, it is preferable that the diffusion stopper film 12 do not contain nitrogen. In this case, it is possible to prevent nitrogen from entering the magnetic tunnel junction element 11 not only from the outside of the element, but also from the diffusion stopper film 12, which would cause the degradation of magnetic property.

In one example shown in FIG. 1, the diffusion stopper film 12 is formed so as to cover the entire side faces of the recording layer 21 and the reference layer 22, but the diffusion stopper film 12 may alternatively be formed so as to cover a part of the side faces of the recording layer 21 and the reference layer 22. Even with this configuration, the out-diffusion of boron from the side faces of the recording layer 21 and the reference layer 22 is suppressed, and as a result, the degradation of magnetic property can be prevented.

In one example shown in FIG. 1, one diffusion stopper film 12 covers the entire side faces of the recording layer 21 and the reference layer 22, but each side face of the recording layer 21 and the reference layer 22 may alternatively be covered by separate diffusion stopper films 12. In this case, the diffusion stopper film 12 covering the side faces of the recording layer 21 needs to contain boron at a concentration higher than the concentration of boron contained in the side edge portions of the recording layer 21, and the diffusion stopper film 12 covering the side faces of the reference layer 22 needs to contain boron at a concentration higher than the concentration of boron contained in the side edge portions of the reference layer 22. This way, it is possible to prevent out-diffusion of boron contained in the recording layer 21 and the reference layer 22, which would cause the degradation of magnetic property.

In one example shown in FIG. 1, the diffusion stopper film 12 is formed outside of the magnetic tunnel junction element 11, but it is also possible to dope the side edge portions of the recording layer 21 and the reference layer 22 with boron by the ion injection method or plasma doping method, thereby forming respective portions containing boron at a concentration higher than that of the center portions of the recording layer 21 and the reference layer 22, respectively.

In this case the side edge portions of the recording layer 21 and the reference layer 22 doped with boron act as the diffusion stopper film 12, and prevent out-diffusion of boron contained in the center portions of the recording layer 21 and the reference layer 22.

Each of the recording layer 21 and the reference layer 22 does not necessarily need to be formed of one ferromagnetic layer, but may include a plurality of other layers than the ferromagnetic layer such as non-ferromagnetic layer and a cap layer. For example, as shown in FIG. 2A, the recording layer 21 may have a structure in which a non-ferromagnetic coupling layer 33 made of Ta is sandwiched between a pair of ferromagnetic layers 31 and 32 made of CoFeB. In the example of FIG. 2A, an insulating layer 34 made of MgO is formed on the side of the recording layer 21 opposite to the insulating layer 23. In the example shown in FIG. 2A, the non-magnetic coupling layer 33 is made of Ta, but the non-magnetic coupling layer 33 may alternatively be made of W, Hf, Zr, Nb, Mo, Ti, Mg, MgO, or the like.

As shown in FIG. 2B, the recording layer 21 may have a structure in which thin CoFe layers 36, 37 are formed at respective sides of the CoFeB layer 35. In the example of FIG. 2B, insulating layers 38, 39 made of MgO are formed on the respective sides of the CoFe layers 36, 37 opposite to the CoFeB layer 36. Those insulating layers 38, 39 can constitute the insulating layer 23 or the insulating layer 34. In the examples shown in FIGS. 2A and 2B, the recording layer 21 has the multi-layer structure, but the reference layer 22 may also have a similar multi-layer structure.

In the example shown in FIG. 1, the spintronics element 10 includes the magnetic tunnel junction element 11, but the invention is not limited thereto, and the spintronics element 10 includes any element as long as it has a ferromagnetic layer containing boron. For example, the spintronics element 10 may have a tunnel magnetoresistance device, a tunnel magnetoresistance memory device, a spin Hall effect device, an inverse spin Hall effect device, a domain wall motion memory device or a spin torque high frequency device.

For example, as shown in FIG. 3, if the spintronics element 10 includes a domain wall motion memory device, by forming the diffusion stopper film 12 at the side faces of the magnetic tunnel junction element 11, the out-diffusion of boron contained in the magnetic tunnel junction element 11 can be prevented, which makes it possible to prevent the degradation of magnetic property.

Working Example 1

The magnetic tunnel junction element (MTJ) 11 shown in FIG. 1 was manufactured, and the tunnel magnetoresistance ratio (TMR ratio) was measured. For comparison, a MTJ without the diffusion stopper film 12 was manufactured, and the TMR ratio was measured. MTJ of FIG. 1 having the diffusion stopper film 12 and MTJ not having the diffusion stopper film 12 are both formed into a cylindrical shape, and the recording layer, reference layer, and insulating layer are configured in the same manner except for the diffusion stopper film 12. For both MTJ with the diffusion stopper film 12 and MTJ without the diffusion stopper film 12, the actual shape thereof is not a true cylindrical shape due to variations in manufacturing processes, but the diameter of the MTJ was calculated based on the assumption that the MTJ is a cylindrical shape based on the resistance value of the element. For the MTJ without the diffusion stopper film 12, three cylindrical MTJs with different diameters were manufactured. The measurement results of the TMR ratio of each MTJ are shown in Table 1. The TMR ratio of Table 1 is a ratio (percentage) with respect to the TMR ratio before the heat treatment (after dry-etching) in the manufacturing process of each MTJ.

TABLE 1

|  | DIAMETER (nm) | TMR RATIO (%) |
| --- | --- | --- |
| MTJ WITHOUT DIFFUSION STOPPER FILM | 50 | 53 |
|  | 56 | 66 |
|  | 86 | 96 |
| MTJ WITH DIFFUSION STOPPER FILM | 50 | 113 |

Figure 4:
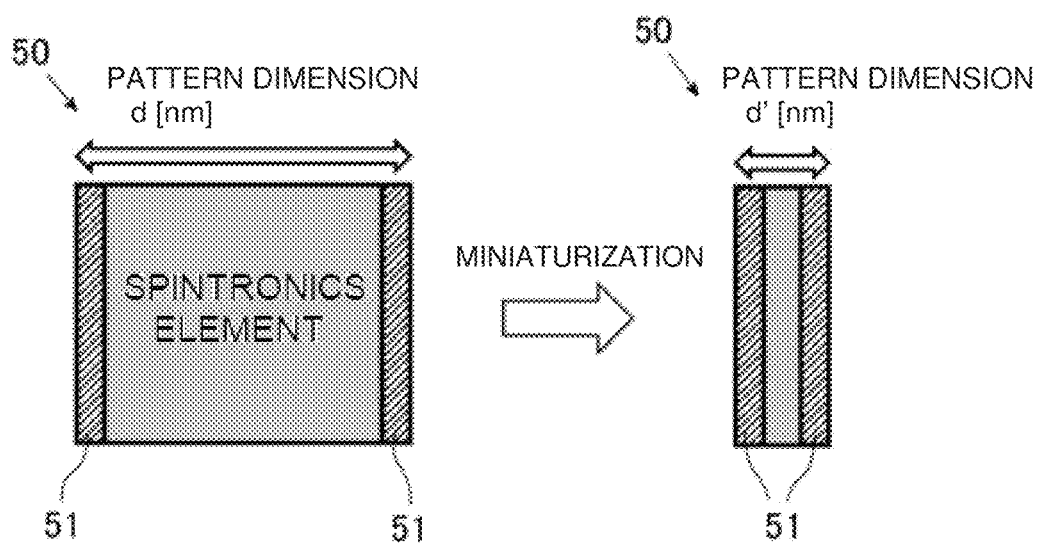
FIG. 4 is a cross-sectional view of a conventional spintronics element before and after miniaturization, showing the distribution of layers with degraded magnetic property with respect to the element.

As shown in Table 1, in the MTJ without the diffusion stopper film 12, the TMR ratio was reduced due to the heat treatment, which confirms that the magnetic property was degraded because of the out-diffusion of boron that occurred in the heat treatment. In the MTJ without the diffusion stopper film 12, as shown in FIG. 4, the smaller the diameter is, the ratio of the layer with degraded magnetic property to the entire element increases, and therefore, the reduction rate of the TMR ratio also increases. On the other hand, in the MTJ of FIG. 1 having the diffusion stopper film 12, the out-diffusion of boron can be prevented by the diffusion stopper film 12, and therefore, the TMR ratio did not decrease after the thermal treatment, or the TMR ratio actually increased.

INDUSTRIAL APPLICABILITY

A spintronics element of the invention can be suitably used for a magnetoresistive random access memory (MRAM) using a spin transfer torque (STT), or in other words, a general memory product or a mixed SoC (system on a chip) product equipped with STT-MRAM, for example.

What is claimed is:
1. A spintronics element, comprising:
a ferromagnetic layer containing boron; and
a diffusion stopper film covering a side face of the ferromagnetic layer partially or entirely, the side face in direct contact with diffusion stopper film, so as to prevent out-diffusion of the boron contained in the ferromagnetic layer,
the diffusion stopper film containing boron at a concentration higher than a concentration of the boron in a portion of the ferromagnetic layer where the ferromagnetic layer contacts the diffusion stopper film.
2. The spintronics element according to claim 1, wherein the diffusion stopper film is free of nitrogen.
3. The spintronics element according to claim 1, further comprising a magnetic tunnel junction element having a recording layer and a reference layer each including the ferromagnetic layer, and an insulating layer disposed between the recording layer and the reference layer,
wherein the diffusion stopper film covers a side face of the magnetic tunnel junction element.
4. The spintronics element according to claim 1, further comprising a magnetic tunnel junction element having a reference layer, a recording layer including the ferromagnetic layer, and an insulating layer disposed between the recording layer and the reference layer,
wherein the diffusion stopper film covers a side face of the recording layer.
5. The spintronics element according to claim 1, further comprising one of a tunnel magnetoresistance device, a tunnel magnetoresistance memory device, a spin Hall effect device, an inverse spin Hall effect device, a domain wall motion memory device or a spin torque high frequency device.

6. A spintronics element, comprising:
a ferromagnetic layer containing boron; and
a diffusion stopper film covering a side face of the ferromagnetic layer partially or entirely so as to prevent out-diffusion of the boron contained in the ferromagnetic layer,
the diffusion stopper film being disposed so as to prevent nitrogen external to the spintronics device from entering the spintronics element.

7. The spintronics element according to claim 6, wherein the diffusion stopper film contains boron at a concentration higher than a concentration of boron contained in a portion of the ferromagnetic layer contacting the diffusion stopper film.

8. The spintronics element according to claim 6, wherein the diffusion stopper film is free of nitrogen.

9. The spintronics element according to claim 6, further comprising a magnetic tunnel junction element having a recording layer and a reference layer each including the ferromagnetic layer, and an insulating layer disposed between the recording layer and the reference layer,
wherein the diffusion stopper film covers a side face of the magnetic tunnel junction element.

10. The spintronics element according to claim 6, further comprising a magnetic tunnel junction element having a reference layer, a recording layer including the ferromagnetic layer, and an insulating layer disposed between the recording layer and the reference layer,
wherein the diffusion stopper film covers a side face of the recording layer.

11. The spintronics element according to claim 6, further comprising one of a tunnel magnetoresistance device, a tunnel magnetoresistance memory device, a spin Hall effect device, an inverse spin Hall effect device, a domain wall motion memory device or a spin torque high frequency device.

* * * * *